(12) United States Patent
Xie et al.

(10) Patent No.: US 11,943,896 B2
(45) Date of Patent: Mar. 26, 2024

(54) WATER-COOLING RADIATOR

(71) Applicant: Dongguan Keepro Electronics Co., Ltd., Dongguan (CN)

(72) Inventors: Liangcheng Xie, Dongguan (CN); Zhichao Tao, Dongguan (CN); Gu Luo, Dongguan (CN)

(73) Assignee: Dongguan Keepro Electronics Co., Ltd., Dongguan (CN)

(*) Notice: Subject to any disclaimer, the term of this patent is extended or adjusted under 35 U.S.C. 154(b) by 294 days.

(21) Appl. No.: 17/647,453

(22) Filed: Jan. 8, 2022

(65) Prior Publication Data

US 2023/0180433 A1   Jun. 8, 2023

(30) Foreign Application Priority Data

Dec. 7, 2021   (CN) .......................... 202111486698.9

(51) Int. Cl.
*H05K 7/20*   (2006.01)
*G06F 1/20*   (2006.01)

(52) U.S. Cl.
CPC ............ *H05K 7/20272* (2013.01); *G06F 1/20* (2013.01); *H05K 7/20263* (2013.01); *G06F 2200/201* (2013.01)

(58) Field of Classification Search
CPC .............. F04D 29/606; H01L 23/473; F28D 2021/0029; G06F 1/206; G06F 1/203; G06F 1/20; G06F 2200/201; H05K 7/20263; H05K 7/20272

See application file for complete search history.

(56) References Cited

U.S. PATENT DOCUMENTS

2019/0104641 A1\* 4/2019 Chang ...................... G06F 1/20
2022/0170705 A1\* 6/2022 Huang .................. F28F 9/0202

\* cited by examiner

*Primary Examiner* — Schyler S Sanks
(74) *Attorney, Agent, or Firm* — Jeenam Park

(57) ABSTRACT

A water-cooling radiator includes a water block, a water cooler, and a water pump. The water cooler includes a cooler body including a heat dissipation area and a water pump installation area, a fan assembly arranged on an upper side of the heat dissipation area, and a fan cover . . . . The water pump installation area is recessed defining a lower installation slot. The lower installation slot and the fan assembly are disposed on a same side of the cooler body. The water pump is detachably arranged in lower installation slot and the fan cover is detachably covered on the cooler body, a fan shielding area and a water pump shielding area are covered on the outside of the fan assembly and the water pump. The water pump is connected with the water block through first hose, and the water block is connected with the cooler body through second hose.

9 Claims, 5 Drawing Sheets

WATER-COOLING RADIATOR

CROSS-REFERENCE TO RELATED APPLICATIONS

This application claims the benefit and priority of Chinese patent application No. 202111486698.9, filed on Dec. 7, 2021, disclosure of which is hereby incorporated by reference in its entirety.

TECHNICAL FIELD

The present application relates to the technical field of computer accessories, in particular to a water-cooling radiator.

BACKGROUND

In the field of computer accessories DIY, water cooling has always been the first choice for high-end enthusiasts to configure computers. Compared with air cooling, water cooling has a good heat dissipation effect for CPU overclocking. The traditional water-cooling radiator includes a water cooler, a water block, and a water pump. The water cooler is installed on the computer case, and the water block is connected to the CPU and absorbs the heat generated by the CPU.

There are mainly four ways to install the water pump of the traditional water-cooling radiator: The first is to integrate the water pump into the water block. Due to the limited internal space of the water block integrated with the water pump, only a miniature water pump with a smaller power can be used, which leads to insufficient pump lift of this type of water-cooling radiator, and the heat dissipation efficiency is much lower than that of the split type water cooling radiator with independent water pump and water block; The second is to integrate the water pump into the water pipe. This method also has the defect of insufficient pump lift; The third is to integrate the water pump into the water cooler, so that the water pump and the water cooler form an integrated structure. This method makes the structure of the water cooler complicated, and the risk of leakage of the water-cooled liquid is higher. The production cost is also much higher than other methods of water-cooling radiator. When the water pump fails to work normally, the entire water cooler needs to be replaced, which leads to high cost for customers. The fourth is a split type water-cooled radiator. The water pump, cold head, and cold exhaust of this water-cooling radiator are connected by water pipes and are independent of each other. Although the heat dissipation efficiency is the highest among all types of water-cooling radiators, the production cost is also the highest. Moreover, due to the numerous components of the split-type water-cooling radiator and the complicated installation method, a huge installation space is required. Users need to spend more money to purchase large-scale high-end case, and due to the large number of pipelines, it is extremely prone to leakage of water-cooling liquid. Therefore, it is necessary to develop a new type of water-cooling radiator.

SUMMARY

In view of the defects in the related art, the present application provides a water-cooling radiator, which can simplify the structure of the water cooler, reduce the user's cost, and is convenient for installation and use.

In order to achieve the above objectives, the present application adopts the following technical solutions:

A water-cooling radiator comprises a water block, a water cooler, and a water pump, wherein the water cooler comprises a cooler body, a fan assembly, and a fan cover. A heat dissipation area and a water pump installation area integrally extending from one end of the heat dissipation area are arranged on the cooler body. The fan assembly is arranged on the upper side of the heat dissipation area, and the upper surface of the water pump installation area is recessed with a lower installation slot corresponding to the shape of the water pump. The lower installation slot and the fan assembly are located on the same side of the cooler body. The water pump is detachably arranged in the lower installation slot. The fan cover comprises a fan shielding area corresponding to the fan assembly and a water pump shielding area corresponding to the water pump. The fan cover is detachably covered on the cooler body, wherein the fan shielding area and the water pump shielding area are respectively covered on the outside of the fan assembly and the water pump. The water pump is connected with the water block through a first hose, and the water block is connected with the cooler body through a second hose.

As an illustrative solution, a plurality of heat dissipation grooves connected end to end in turn are arranged on the heat dissipation area, wherein heat sinks are arranged between the heat dissipation grooves. The cooler body is provided with a first water inlet and a first water outlet which are in communication with the heat dissipation grooves, the water pump is provided with a second water inlet and a second water outlet, the water block is provided with a third water inlet and a third water outlet, wherein the second water outlet is connected to the third water inlet through the first hose, and the third water outlet is connected to the first water inlet through the second hose.

As an illustrative solution, the first water outlet is arranged in the lower installation slot, and the second water inlet is provided with a sealed plug-in tube corresponding to the first water outlet, and the sealed plug-in tube is inserted into the first water outlet.

As an illustrative solution, the cooler body is rectangular, the water pump installation area is located at one end of the cooler body in the longitudinal direction, the axial direction of the water pump is parallel to the width direction of the cooler body.

As an illustrative solution, an upper installation slot corresponding to the lower installation slot is arranged on the lower surface of the water pump shielding area of the fan cover, a first through hole for partially exposing the water pump is arranged in the middle of the upper installation slot, an upper protrusion is formed on the upper surface of the fan cover at a position corresponding to the upper installation slot.

As an illustrative solution, a shock-absorbing rubber ring or a shock-absorbing gasket is arranged on the peripheral surface of the water pump.

As an illustrative solution, two shock-absorbing rubber rings are sleeved on the peripheral surface of the water pump, which are arranged spaced apart from each other, the lower installation slot and the upper installation slot are both provided with positioning grooves for fixing the shock-absorbing rubber ring, wherein when assembling, the shock-absorbing rubber ring is partially embedded in the positioning groove, and a gap is maintained between the peripheral surface of the water pump and the inner surfaces of the lower and upper installation slots.

As an illustrative solution, a light guide and an LED light bar for guiding the light guide are arranged between the fan assembly and the fan cover, the LED light bar is located inside the fan cover, and a plurality of light-transmitting holes are arranged on the fan cover, wherein a second through hole for exposing the fan assembly is arranged on both the light guide and the fan cover.

As an illustrative solution, a water block housing is arranged on the upper side of the water block, a blowing fan that blows downward is arranged in the water block housing, a downwardly inclined air outlet is arranged at the lower part of the peripheral side of the water block housing.

As an illustrative solution, a light source is arranged in the water block housing, a light guide cover is arranged on the upper end of the water block housing, a light-shielding cover is arranged on the upper side of the light guide cover, a light-transmitting groove for partially exposing the light guide cover is arranged on the light-shielding cover, air inlet holes are arranged on the peripheral side of the light shielding cover.

Compared with the related art, the present application has obvious advantages and beneficial effects. Specifically, by providing the water pump installation area on the cooler body, the water pump can be fixed on the cooler body through the fan cover, so that only the water cooler and the water block need to be fixed during installation, which is simple and convenient to use. In addition, the water pump of the present application can choose the same high-power water pump components as the split type water-cooling radiator. Compared with a water-cooling radiator with a water block integrated with a water pump, a water-cooling radiator with a water pipe integrated with a water pump, a water-cooling radiator with a water cooler integrated with a water pump, the independent water pump of the present application can provide a larger lift for the water-cooling radiator and greatly improve the heat dissipation efficiency. At the same time, this application does not need to change the internal structure of the water-cooling radiator, which reduces the complexity of the water-cooling radiator and reduces the production cost of the enterprise. When the water pump is not working properly, it can be easily replaced, and the space required for installation has not increased, and the user does not need to purchase a larger case, which reduces the cost for the user.

In order to more clearly illustrate the structural features, technical means, and specific objectives and functions achieved by the present application, the following further describes the application in detail with reference to the accompanying drawings and specific embodiments:

Figure 1:
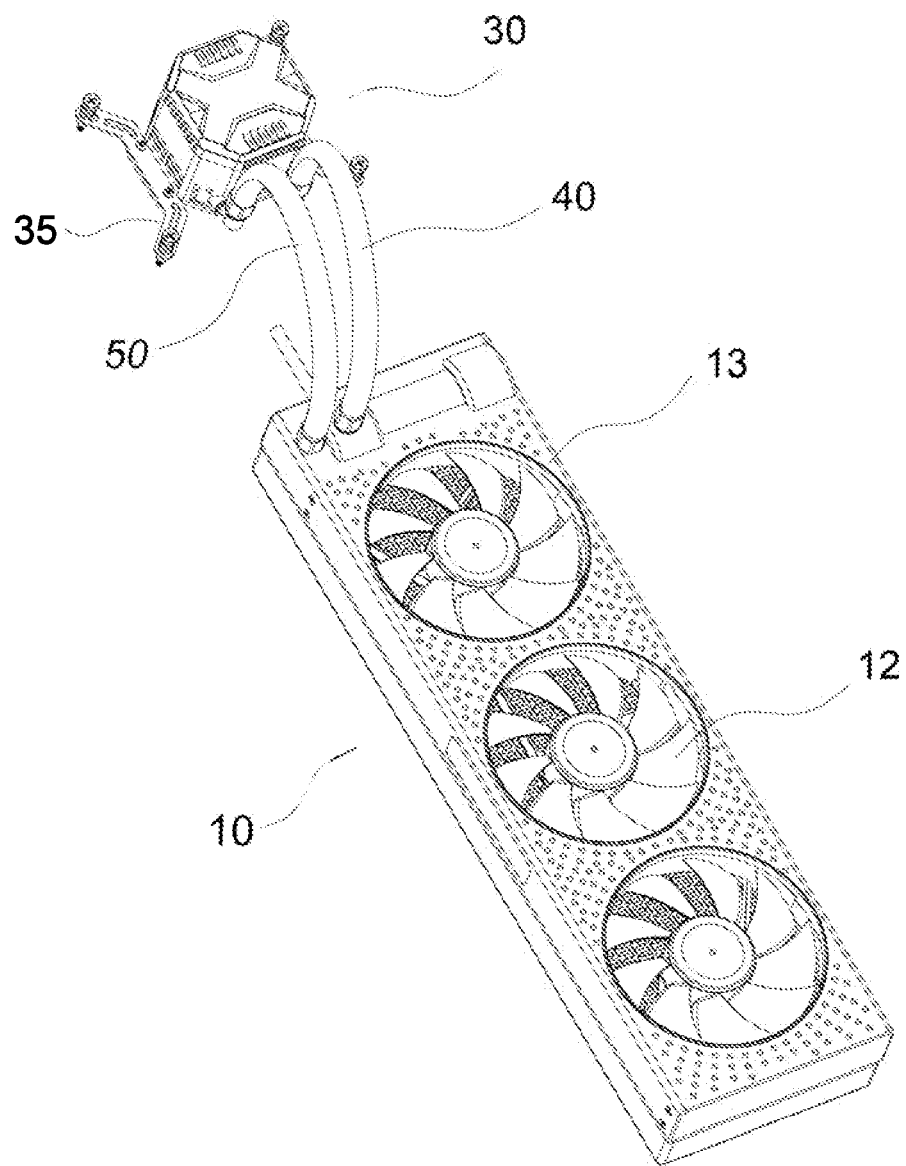
FIG. 1 is a schematic diagram of the assembled structure of according to an embodiment of the present application.
Figure 2:
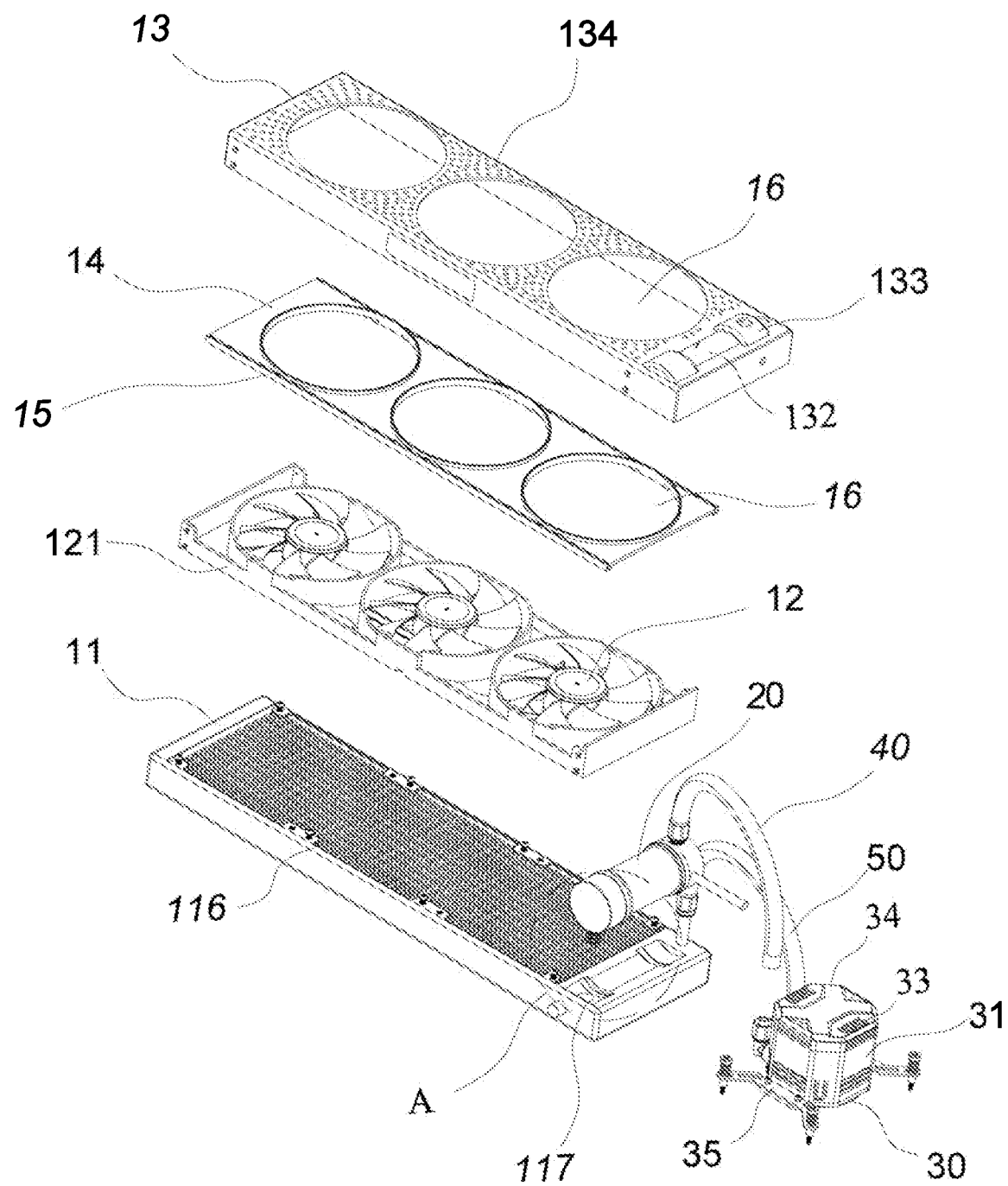
FIG. 2 is a schematic diagram of an exploded structure of the water cooler according to an embodiment of the present application.
Figure 3:
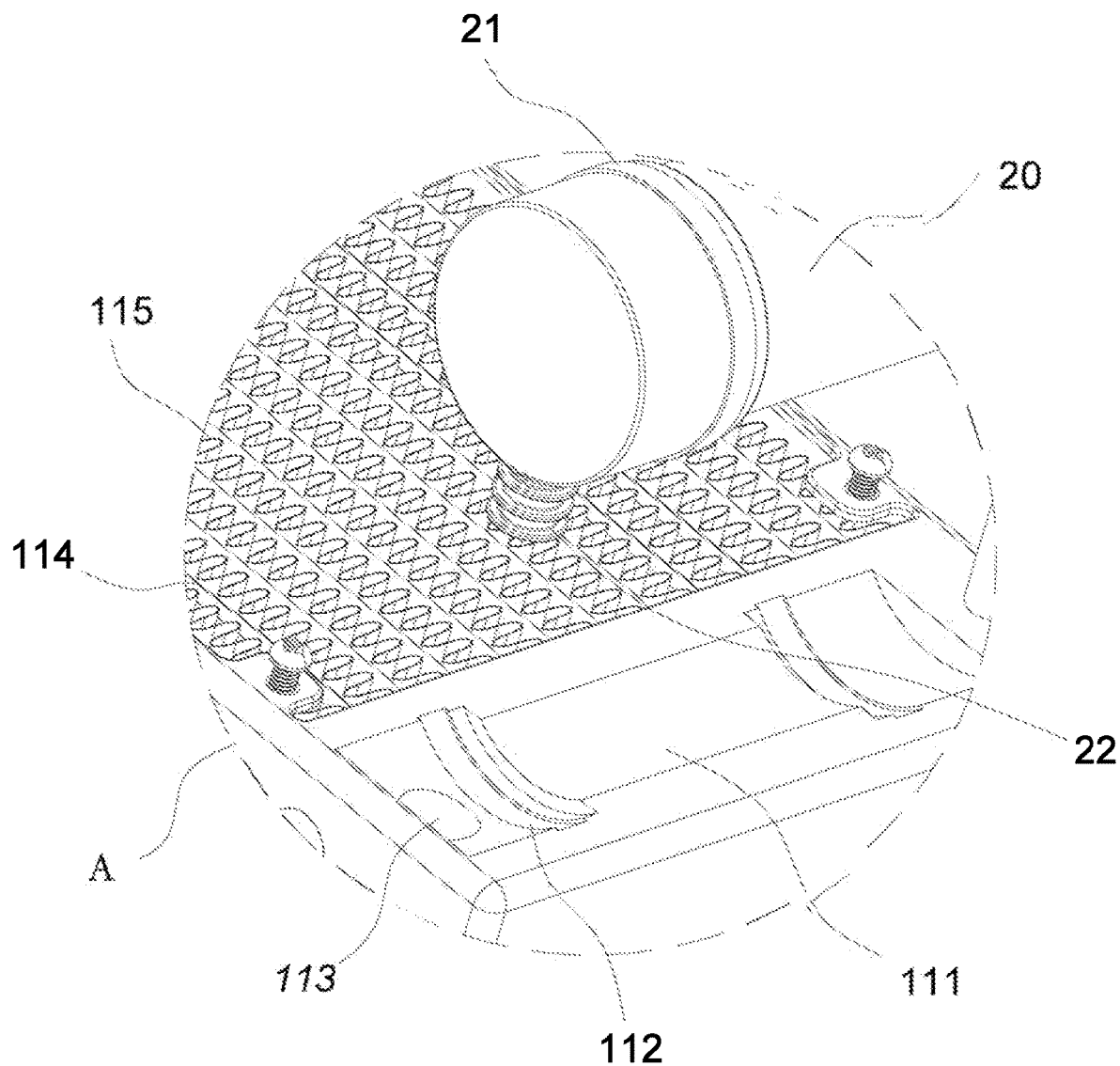
FIG. 3 is an enlarged schematic diagram at A in FIG. 2.
Figure 4:
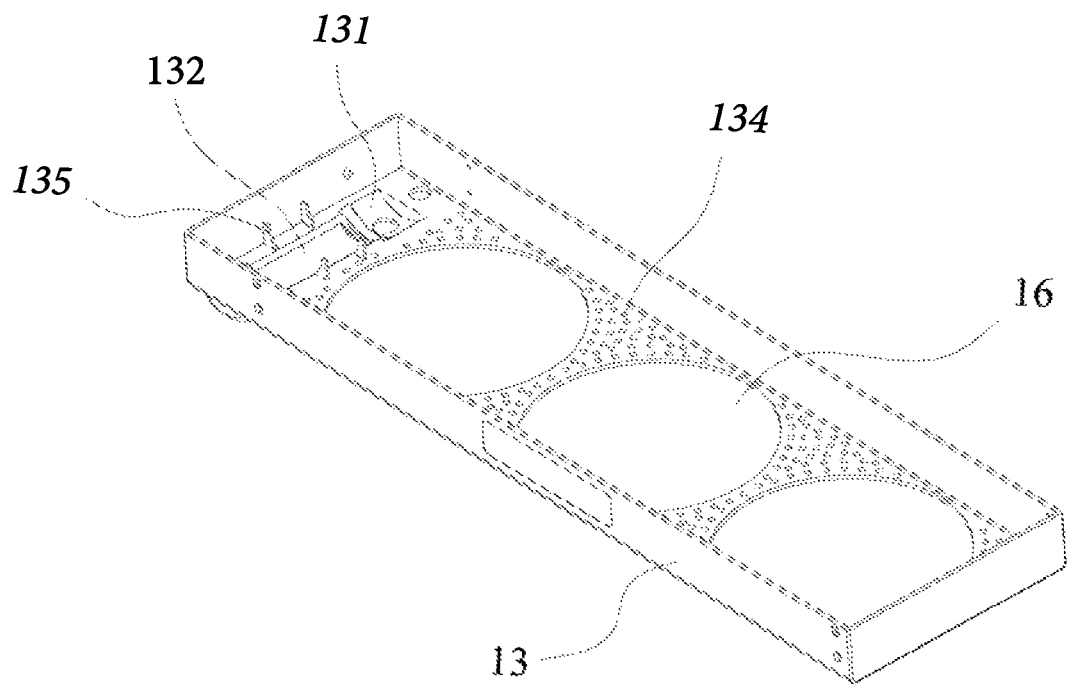
FIG. 4 is a schematic diagram of the internal structure of the fan cover according to an embodiment of the present application.

| 10. Water cooler | 11. Cooler body | 111. Lower installation slot |
| 112. Positioning groove | 113. First water outlet | 114. Heat dissipation groove |
| 115. Heat sink | 116. Heat dissipation area | 117. water pump installation area |
| 12. Cooling fan | 121. Fan mounting seat | 13. Fan cover |
| 131. Upper installation slot | 132. First through hole | 133. Upper protrusion |
| 134. Light-transmitting hole | 135. Clamp block | 14. Light guide |
| 15. LED light bar | 16. Second through hole | 20. Water pump |
| 21. Shock-absorbing rubber ring | 22. Sealed plug-in tube | 30. Water block |
| 301. Third water inlet | 302. Third water outlet | 31. Water block housing |
| 311. Air outlet | 32. Blowing fan | 33. Light guide cover |
| 34. Light-shielding cover | 341. Light-transmission groove | 342. Air inlet |
| 35. Buckle | 40. First hose | 50. Second hose. |

DETAILED DESCRIPTION OF ILLUSTRATIVE EMBODIMENTS

In the description of the present application, it should be noted that the terms "center", "upper", "lower", "left", "right", "vertical", "horizontal", "inner", "outer", etc. which are used to indicate position or positional relationship are based on the position or positional relationship shown in the drawings, and are only for the convenience of describing the application and simplifying the description, rather than indicating or implying that the indicated position or element must have a specific orientation and be constructed in a specific orientation and operation, therefore cannot be understood as a limitation of the present application.

In the description of the present application, it should be noted that unless otherwise clearly specified and defined, the terms "installation", and "connection" should be understood in a broad sense, for example, it can be a fixed connection or a detachable connection, or integrally connected; it can be a mechanical connection or an electrical connection; it can be directly connected, or indirectly connected through an intermediate medium, and it can be the internal communication between two components. For those skilled in the art, the specific meaning of the above-mentioned terms in the present application can be understood according to the specific circumstances.

As shown in FIG. 1-5, a water-cooling radiator includes a water block 30, a water cooler 10 and a water pump 20. The water cooler 10 comprises a cooler body 11, a fan assembly, and a fan cover 13. A heat dissipation area 116 and a water pump installation area 117 integrally extending from one end of the heat dissipation area 116 are arranged on the cooler body 11. The cooler body 11 is rectangular, the water pump installation area 117 is located at one end of the cooler body 11 in the longitudinal direction. The fan assembly is arranged on the upper side of the heat dissipation area 116, and the upper surface of the water pump installation area 117 is recessed with a lower installation slot 111 corresponding to the shape of the water pump 20, wherein the lower installation slot 111 and the fan assembly are located on the same side of the cooler body 11, wherein the water pump 20 is detachably arranged in the lower installation slot 111 and the axial direction of the water pump 20 is parallel to the width direction of the cooler body 11. The fan cover 13 comprises a fan shielding area corresponding to the fan assembly and a water pump shielding area corresponding to the water pump 20, the fan cover 13 is detachably covered on the cooler body 11, wherein the fan shielding area and the water pump shielding area are respectively covered on the outside of the fan assembly and the water pump 20, and the water pump 20 is connected with the water block 30 through a first hose 40, and the water block 30 is connected with the cooler body 11 through a second hose 50. In this application, the fan cover 13 is detachably connected to the cooler body 11 by locking screws on the side. In the actual production process, the fan cover 13 can also be detachably connected to the cooler body 11 in a snap-fit manner. Since the fan cover 13 is a detachable structure, different styles can be set according to user requirements to meet different customer needs. By locating the lower installation slot 111 and the fan assembly on the same side of the cooler body 11, it is more conducive to the molding of the cooler body 11 and the production cost is reduced; by making the axial direction of the water pump 20 parallel to the width direction of the cooler body 11, the overall length of the cooler body 11 is effectively shortened, and the installation space inside the computer case is saved.

Specifically, a plurality of heat dissipation grooves 114 connected end to end in turn are arranged on the heat dissipation area 116, wherein heat sinks 115 are arranged between the heat dissipation grooves 114, the cooler body 11 is provided with a first water inlet and a first water outlet 113 which are in communication with the heat dissipation grooves 114, the water pump 20 is provided with a second water inlet and a second water outlet, the water block 30 is provided with a third water inlet 301 and a third water outlet 302, wherein the second water outlet is connected to the third water inlet 301 through the first hose 40, and the third water outlet 302 is connected to the first water inlet through the second hose 50. The first water outlet 113 is arranged in the lower installation slot 111, and the second water inlet is provided with a sealed plug-in tube 22 corresponding to the first water outlet 113. When assembling, the sealed plug-in tube 22 is inserted into the first water outlet 113. When the fan cover 13 is installed on the water cooler, the water pump 20 is also fixed in the lower installation slot 111 synchronously, to avoid the situation that the sealed plug-in tube 22 is loose and the water-cooling liquid leaks.

An upper installation slot 131 corresponding to the lower installation slot 111 is arranged on the lower surface of the water pump shielding area of the fan cover 13, a first through hole 132 for partially exposing the water pump 20 is arranged in the middle of the upper installation slot 131, an upper protrusion 123 is formed on the upper surface of the fan cover 13 at a position corresponding to the upper installation slot 131. In the lower surface of the water pump shielding area, clamp blocks 135 for positioning the water pump 20 are provided on both sides of the first through hole 132. In the present application, the water pump 20 is a water pump with an independent integrated water tank, and the water tank is transparent. By providing the first through hole 132, it is possible to observe whether the water-cooling liquid in the water tank of the water pump 20 is flowing through the first through hole 132, to determine whether the water pump 20 is working normally.

Two shock-absorbing rubber rings 21 are sleeved on the peripheral surface of the water pump 20, which are arranged spaced apart from each other. The lower installation slot 111 and the upper installation slot 131 are both provided with positioning grooves 112 for fixing the shock-absorbing rubber ring 21, wherein when assembling, the shock-absorbing rubber ring 21 is partially embedded in the positioning groove 112, and a gap is maintained between the peripheral surface of the water pump 20 and the inner surfaces of the lower and upper installation slots 111, 131. Therefore, the buffer and isolation effects of the shock-absorbing rubber ring 21 can prevent the water pump 20 from colliding with the cooler body 11 and the fan cover 13 during operation, thereby reducing the generation of noise. It should be understood that the number and spacing of the shock-absorbing rubber ring 21 can be set according to needs. In actual use, the shock-absorbing rubber ring 21 can also be replaced by a shock-absorbing gasket, and the shock-absorbing rubber ring 21 and the shock-absorbing gasket can be made of silicone, but it can also be made of other elastic materials.

In the present application, a light guide 14 is provided between the fan assembly and the fan cover 13, and an LED light bar 15 for guiding the light guide 14 is provided on the outer side of the light guide 14, and the LED light bar 15 is located on the inner side of fan cover 13, the fan cover 13 is provided with a plurality of light-transmitting holes 134. The light-transmitting hole 134 can be set in a variety of different shapes, and the light emitted by the LED light bar 15 is transmitted through the light-transmitting hole 134 to form a visual effect, which increases the overall aesthetics of the product and meets the needs of different users. Both the light guide 14 and the fan cover 13 are provided with a second through hole 16 for exposing the fan assembly, so that the air flow is discharged from the second through hole 16 when the fan assembly is working.

In the present application, the fan assembly comprises a fan mounting seat 121 and at least one cooling fan 12 arranged on the fan mounting seat 121. In this embodiment, the number of cooling fans 12 is three arranged side by side. It should be understood that the number of cooling fans 12 can be set according to actual needs.

Figure 5:
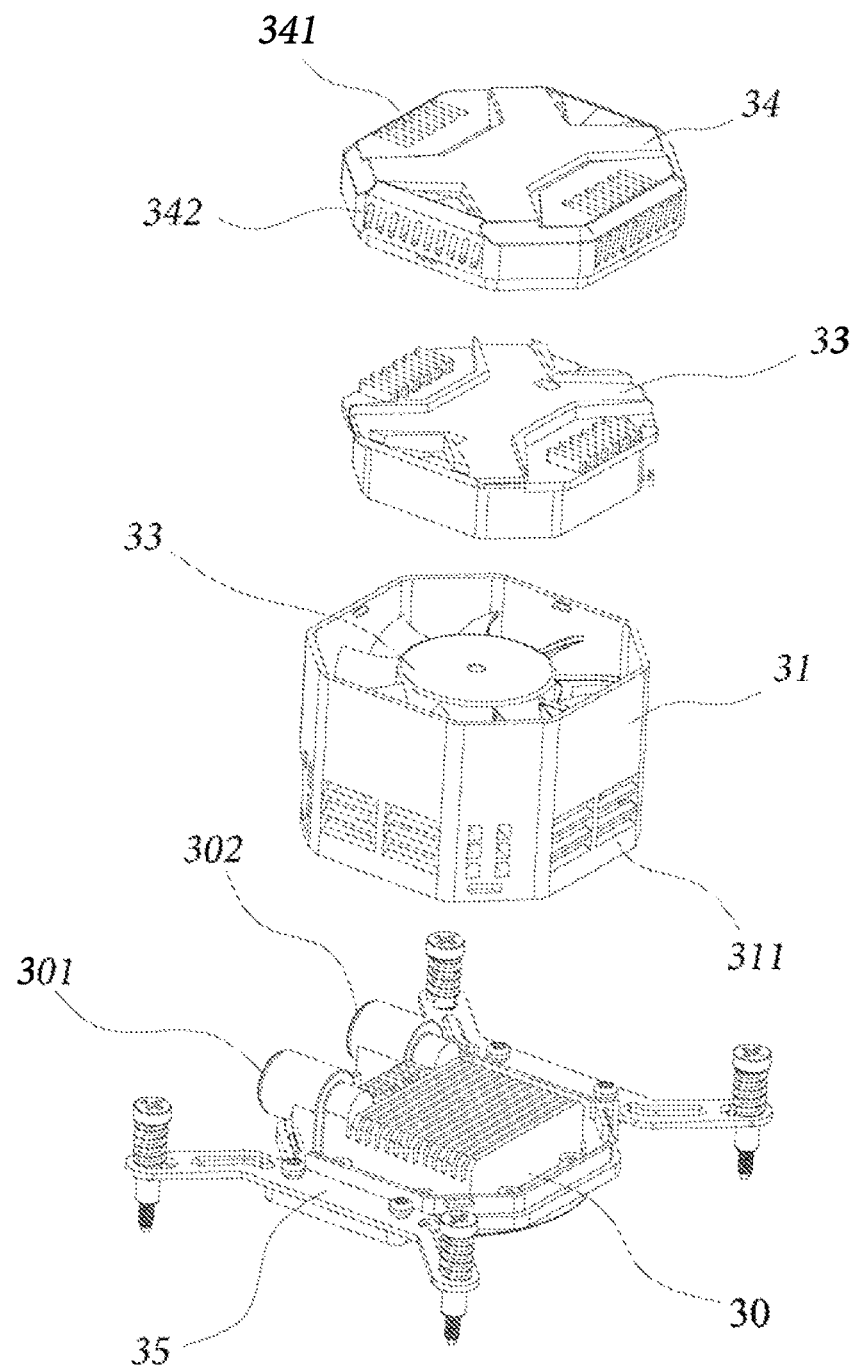
FIG. 5 is a schematic diagram of an exploded structure of the upper part of the water block according to an embodiment of the present application.

As shown in FIG. 5, a water block housing 31 is arranged on the upper side of the water block 30, a blowing fan 32 that blows downward is arranged in the water block housing 31, a downwardly inclined air outlet 311 is arranged at the lower part of the peripheral side of the water block housing 31. By providing the air blowing fan 32, the air blowing fan 32 can assist the water block 30 to dissipate heat and improve the heat dissipation efficiency. By providing the downwardly inclined air outlet 311 at the lower peripheral side of the water block housing 31, part of the air flow blown by the air blowing fan 32 can be guided to the circuit on the peripheral side of the CPU, so that peripheral circuits and electronic components can be actively dissipated.

The water block housing 31 is provided with a light source (not shown), the upper end of the water block housing 31 is provided with a light guide cover 33, and the upper side of the light guide cover 33 is provided with a light-shielding cover 34. A light-transmitting groove 341 for partially exposing the light guide cover 33 is arranged on the light-shielding cover 34, air inlet holes 342 are arranged on the peripheral side of the light shielding cover 34. The air inlet holes 342 are in communication with the inside of the water block housing 31. The light-transmitting groove 341 can be set in a variety of different shapes. Through the cooperation of the light guide cover 33 and the light-shielding cover 34, the LED light can be transmitted from the light-transmitting groove 341. In this way, different luminous effects of the cold head 30 can be realized, the water-cooling radiator is more personalized, and the overall aesthetics of the product is increased.

The water block 30 is provided with a buckle 35 for fixing the water block 30 to the CPU. When in use, the buckle 35 is locked on the main board by screws. The cold head 30 is provided with a labyrinth-shaped coolant water channel separated by a large number of shovel tooth copper sheets (not shown). The cooling water channel is in communication with the aforementioned third water inlet and third water outlet, and the upper side of the coolant water channel is provided with a metal upper cover. By providing a large number of shovel tooth copper sheets, the heat conduction area can be increased, and the heat dissipation efficiency can be improved.

To sum up, in the present application, by providing the water pump installation area 117 on the cooler body, the water pump can be fixed on the cooler body through the fan cover, so that only the water cooler and the water block need to be fixed separately during installation, which is simple and convenient to use. In addition, the water pump of the present application can choose the same high-power water pump components as the split type water-cooling radiator. Compared with a water-cooling radiator with a water block integrated with a water pump, a water-cooling radiator with a water pipe integrated with a water pump, a water-cooling radiator with a water cooler integrated with a water pump, the independent water pump of the present application can provide a larger lift for the water-cooling radiator and greatly improve the heat dissipation efficiency. At the same time, this application does not need to change the internal structure of the water-cooling radiator, which reduces the complexity of the water-cooling radiator and reduces the production cost of the enterprise. When the water pump is not working properly, it can be easily replaced, and the space required for installation has not increased, and the user does not need to purchase a larger case, which reduces the cost for the user.

The above are only the preferred embodiments of the present application and are not intended to limit the application. Therefore, any modification, equivalent replacement, improvement, etc., made to the above embodiments based on the actual technology of the present application still fall within the scope of the technical solution of the present application.

What is claimed is:

1. A water-cooling radiator, comprising a water block, a water cooler, and a water pump, wherein the water cooler comprises a cooler body, a fan assembly, and a fan cover, wherein a heat dissipation area and a water pump installation area integrally extending from one end of the heat dissipation area are arranged on the cooler body, wherein the fan assembly is arranged on an upper side of the heat dissipation area, and an upper surface of the water pump installation area is recessed to define a lower installation slot corresponding to a shape of the water pump, wherein the lower installation slot and the fan assembly are disposed on a same side of the cooler body, wherein the water pump is detachably arranged in the lower installation slot, wherein the fan cover comprises a fan shielding area corresponding to the fan assembly and a water pump shielding area corresponding to the water pump, the fan cover is detachably covered on the cooler body, wherein the fan shielding area and the water pump shielding area are respectively covered on an exterior of the fan assembly and the water pump, and wherein the water pump is connected with the water block through a first hose, and the water block is connected with the cooler body through a second hose, wherein an upper installation slot corresponding to the lower installation slot is defined in the lower surface of the water pump shielding area of the fan cover, a first through hole for partially exposing the water pump is arranged in a middle of the upper installation slot, an upper protrusion is formed on an upper surface of the fan cover at a position corresponding to the upper installation slot.

2. The water-cooling radiator as recited in claim 1, wherein a plurality of heat dissipation grooves are arranged on the heat dissipation area, respectively, wherein heat sinks are arranged between the heat dissipation grooves, the cooler body is provided with a first water inlet and a first water outlet which are in communication with the heat dissipation grooves, the water pump is provided with a second water inlet and a second water outlet, the water block is provided with a third water inlet and a third water outlet, wherein the second water outlet is connected to the third water inlet through the first hose, and the third water outlet is connected to the first water inlet through the second hose.

3. The water-cooling radiator as recited in claim 2, wherein the first water outlet is arranged in the lower installation slot, and the second water inlet is provided with a sealed plug-in tube corresponding to the first water outlet, and the sealed plug-in tube is inserted into the first water outlet.

4. The water-cooling radiator as recited in claim 1, wherein the cooler body is rectangular-shaped, the water pump installation area is located at one end of the cooler body in a length thereof, an axial direction of the water pump is parallel to a width of the cooler body.

5. The water-cooling radiator as recited in claim 1, wherein a shock-absorbing rubber ring or a shock-absorbing gasket is arranged on the peripheral surface of the water pump.

6. The water-cooling radiator as recited in claim 5, wherein two shock-absorbing rubber rings are sleeved on the peripheral surface of the water pump, which are arranged spaced apart from each other, the lower installation slot and the upper installation slot are each provided with a positioning groove for fixing the shock-absorbing rubber ring, wherein when assembling, the shock-absorbing rubber ring is partially embedded in the positioning groove, and a gap is maintained between the peripheral surface of the water pump and the inner surfaces of the lower and upper installation slots.

7. The water-cooling radiator as recited in claim 1, wherein a light guide and an LED light bar for guiding the light guide are arranged between the fan assembly and the fan cover, the LED light bar is disposed inside the fan cover, and a plurality of light-transmitting holes are defined in the fan cover, wherein a second through hole for exposing the fan assembly is defined in each of the light guide and the fan cover.

8. The water-cooling radiator as recited in claim 1, wherein a water block housing is arranged on an upper side of the water block, a blowing fan that blows downward is arranged in the water block housing, a downwardly inclined air outlet is defined in a lower part of a peripheral side of the water block housing.

9. The water-cooling radiator as recited in claim 8, wherein a light source is arranged in the water block housing, a light guide cover is arranged on an upper end of the water block housing, a light-shielding cover is arranged on an upper side of the light guide cover, a light-transmitting groove for partially exposing the light guide cover is defined in the light-shielding cover, air inlet holes are defined in a peripheral side of the light shielding cover.

\* \* \* \* \*